United States Patent [19]

Dano et al.

[11] 4,058,744
[45] Nov. 15, 1977

[54] THERMALLY STABILIZED CRYSTAL MOUNTING ASSEMBLY

[75] Inventors: Arnold Vincent Dano, Park Ridge; Jerry James Tomaszewski, Addison; Jerome Peter Friedrichs, Des Plaines, all of Ill.

[73] Assignee: Motorola, Inc., Schaumburg, Ill.

[21] Appl. No.: 693,470

[22] Filed: June 7, 1976

[51] Int. Cl.² .......................................... H01L 41/04
[52] U.S. Cl. .................................................. 310/343
[58] Field of Search .................... 310/8.9, 9; 219/210; 331/69

[56] References Cited

U.S. PATENT DOCUMENTS

| | | | |
|---|---|---|---|
| 2,915,612 | 12/1959 | Font | 310/9 X |
| 3,002,117 | 9/1961 | Vogt | 310/9 |
| 3,201,621 | 8/1965 | Milner | 310/8.9 |
| 3,749,879 | 7/1973 | Armstrong | 310/8.9 X |

Primary Examiner—Mark O. Budd
Attorney, Agent, or Firm—Margaret Marsh Parker; James W. Gillman

[57] ABSTRACT

A unitary molded socket provides mounting for non-temperature compensated crystals, a resistor heating element for each crystal, and a thermistor. Each heating element is positioned adjacent a crystal housing for preventing the housing temperature from going below a given temperature. The thermistor is thermally coupled to one of the resistors for sensing its temperature and electrically coupled to control circuitry for providing the appropriate heating current to the resistor heating elements. A spring clip biases each crystal against its resistor, clamps it into the socket and is pivotable for replacement of components.

11 Claims, 5 Drawing Figures

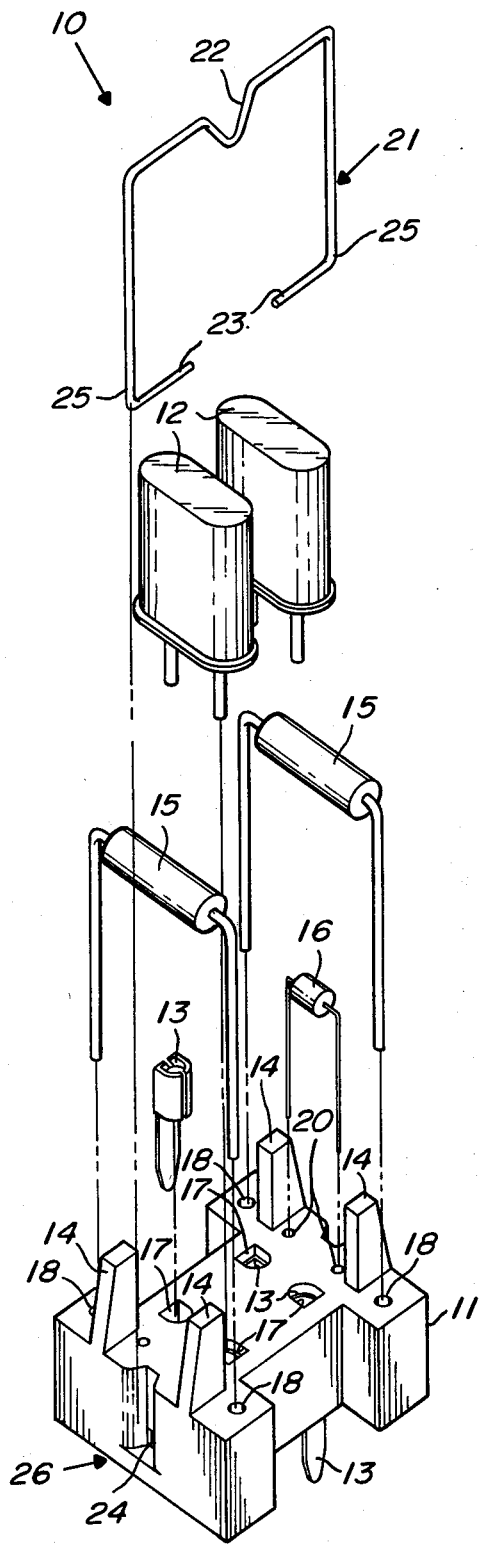
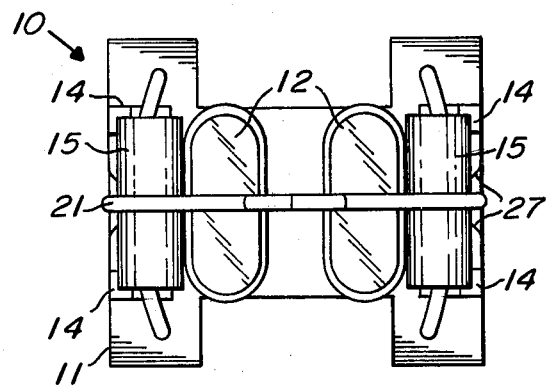
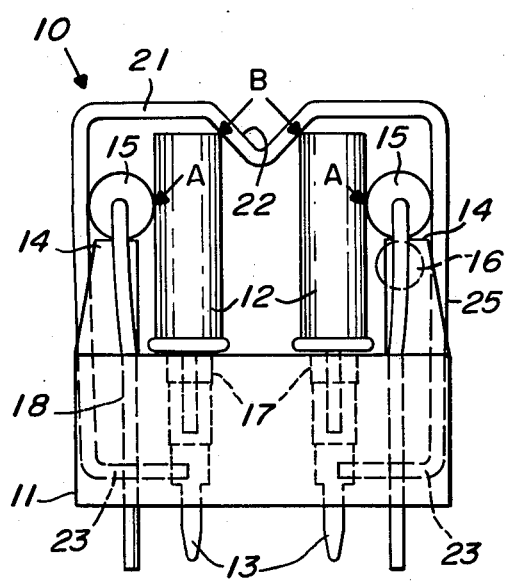

THERMALLY STABILIZED CRYSTAL MOUNTING ASSEMBLY

BACKGROUND OF THE INVENTION

This invention relates to the field of crystals as used for frequency control of electronic apparatus and particularly to the frequency stabilization of such crystals.

Since the fundamental reason for using a crystal for frequency control is the ability to control within extremely narrow limits, and since crystals lose that ability at very low temperatures, it is imperative to compensate in some fashion for low ambient temperatures. Several approaches are known in the art, including mechanical structures whereby physical pressure in proportion to the temperature is applied to the crystal for maintaining the correct frequency regardless of temperature. Other methods have included heating the crystal by means of gold or silver heating elements evaporated onto the surface of the crystal, and heating the crystal in an elaborately controlled, single or double "oven" or housing. Crystals may also be frequency stabilized by electronic means, i.e., external circuitry may sense the ambient temperature and automatically adjust circuit values to "tune" the crystal to the correct frequency. All of the known prior art involves high cost or complexity or both.

SUMMARY OF THE INVENTION

It is therefore an object of the present invention to provide a simple, relatively expensive, yet effective means of maintaining the frequency stability of a crystal. It is a particular object to maintain this frequency stability in a non-temperature compensated crystal by preventing the temperature of the crystal from going below the range of stable operation.

These objectives are provided in an assembly constructed in accordance with the invention by a unitary molded socket having provision for mounting a non-temperature compensated crystal, a resistor and a thermistor. The resistor, with the thermistor bound to it, is supported on pedestals on the socket to position it adjacent the mid point of the crystal. If, when the apparatus is turned on, the ambient temperature inside the apparatus housing is below the range at which the crystal is stable, the thermistor sends a signal to a temperature control circuit. The control circuit then supplies sufficient current to the resistor to provide an ambient temperature in the proper range for the crystal. One thermistor and a single control circuit may provide the same function for any number of resistor-crystal pairs.

BRIEF DESCRIPTION OF THE DRAWING

FIG. 1 is an exploded view of a mounting assembly constructed in accordance with the invention.

FIG. 2 is an elevational view of the assembly of FIG. 1.

FIG. 3 is a top view of the assembly of FIG. 1.

DETAILED DESCRIPTION OF THE PREFERRED EMBODIMENT

Figure 4:
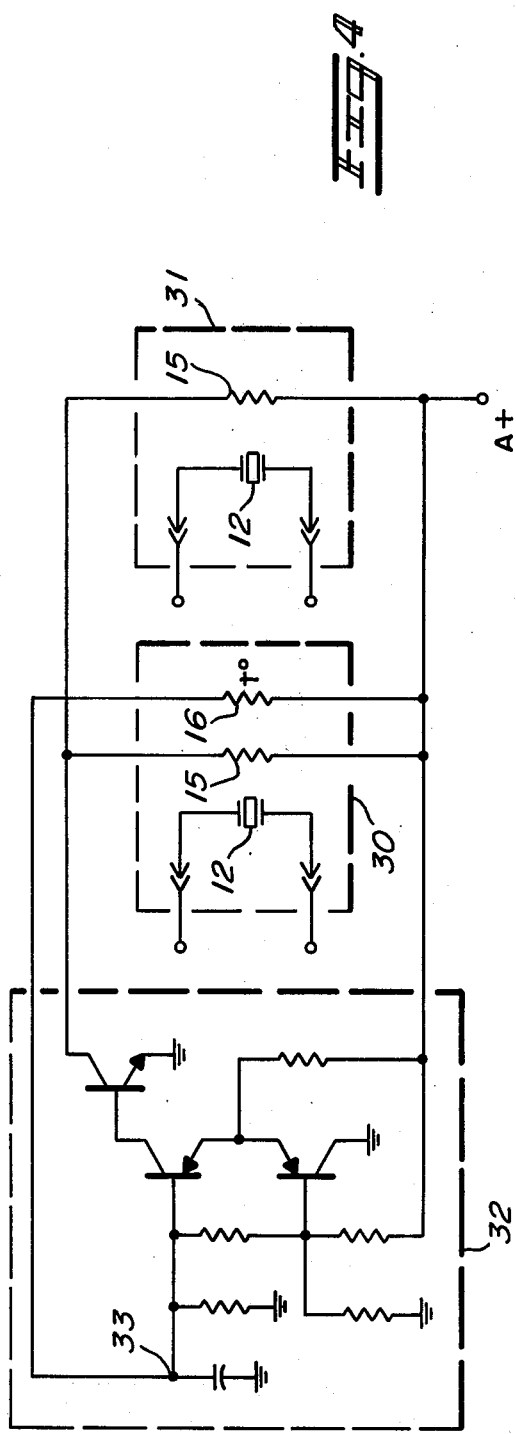
FIG. 4 is a schematic diagram showing a control circuit and its connections to the electrical components of FIG. 1.

The thermally stabilized crystal mounting assembly of the invention is best understood with reference to the drawing in which like numerals are used throughout to represent like parts.

Figure 5:
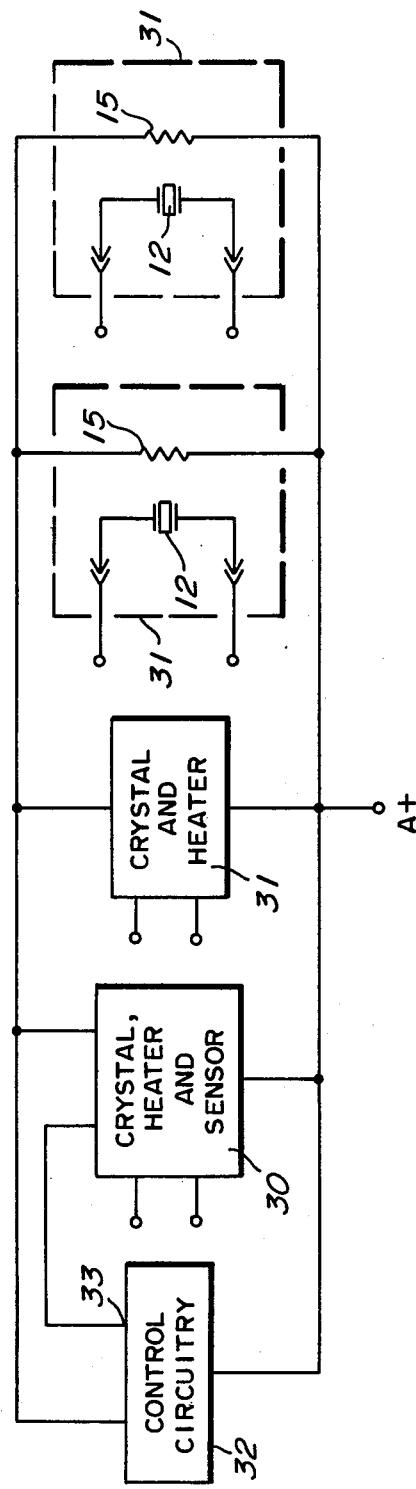
FIG. 5 is a part block-part schematic diagram of a second embodiment of the invention showing the circuitry of FIG. 4 with additional units added.

FIGS. 1, 2 and 3 are views of an embodiment accommodating two crystals, but it is to be noted that the invention is equally applicable to one crystal or many. FIG. 5 shows the electrical connections for an extended version.

In FIG. 1, the entire assembly 10 is shown in an exploded view for clarity. A unitary socket 11 for two crystals 12 (shown in customary housings) is molded of a rigid plastic insulating material and has apertures for four solderable metal socket contacts 13, one of which has been raised above the socket 11 for clarity. Four pedestals 14, integrally formed with the socket, provide support and positioning for two resistors 15 as shown in FIG. 2. The resistors 15 may be small carbon resistors of low value; e.g. 100 ohms. A thermistor 16 is tightly attached to one of the resistors 15 for sensing the temperature thereof. Four apertures 17 for the socket contacts 13 are shown in this embodiment. Four apertures 18 are shown for receiving the leads of the resistors 15. Four apertures 20 are shown for receiving the leads of the thermistor 16, although only two are required, since this makes the socket symmetrical and thus reversible. The leads of the resistors 15 and the thermistor 16 may extend beyond the socket and be electrically connected in any desired fashion. A spring tempered, stainless steel wire spring 21 is mounted on the socket 11 for providing biasing pressure on the resistors 15 against the housings of the crystals 12 at the point A. The top of the spring 21 has a "vee" conformation 22 which presses against the crystal housings at points B, biasing the housings against the resistors and against the socket 11, thus providing essential clamping and shock mounting capability. The spring 21 has ends 23 which are pivotally received in apertures 24 in the socket 11. A portion of each side 25 of the spring 21 is received in a slot 26 in the socket 11, whereby the spring snaps into a stable, locking position as shown in FIGS. 2 and 3. The slot 26 has rounded edges for easier locking and unlocking of the spring 21 but is deep enough for strong clamping action in the locked position. There is no possibility that shock or vibration could unlock the spring 21. In the unlocked or unstable position, the spring will rotate easily in the apertures 24, providing easy access to the components on the socket.

FIG. 4 is a schematic diagram in which sections 30 and 31 (in dashed lines) represent the components shown in FIGS. 1-3, and a circuit is shown in the section 32 (in dashed lines) which exemplifies the control circuit to be used with the invention. The thermistor 16 in the block 30 senses the temperature of the adjacent resistor 15 and send an appropriate signal to the point 33 of the control circuit 32. The circuit 32 is designed to output a current to all of the resistors 15 when the crystals are operating in an ambient temperature lower than a given temperature. This given temperature, which may be in the range −10° to 0° C., is the lowest temperature at which the frequencies of the crystals are stable. The details of the control circuit form no part of the invention other than as described herein. The crystals 12 are coupled to various portions of the electronic apparatus circuitry (not shown) for frequency control functions, as is well known in the art.

Another embodiment is shown in FIG. 5 having sections 30, 31 and 32 of FIG. 4 shown as blocks 30, 31 and 32 and having additional sections 31 coupled to the control circuit 32. It is to be noted that, within the scope of the invention, all of the crystals need not be identical, and that each resistor 15 need only be the appropriate value for heating the associated crystal.

Thus, there has been provided, according to the invention, a simple and inexpensive means of frequency stabilizing one or more relatively low cost crystals for use in electronic apparatus. It is intended to cover all variations and modifications of the invention as fall within the spirit and scope of the appended claims.

What is claimed is:

1. A crystal stabilizing assembly for electronic apparatus comprising:
   a frequency controlling crystal coupled to a portion of the circuitry of the electronic apparatus for controlling the frequency of said portion;
   a hermetically sealed crystal housing for retaining the crystal;
   a heating element in contact with the outer surface of the crystal housing and thermally coupled to said housing;
   temperature sensing means in contact with said heating element for sensing the temperature of said heating element, and for providing an output in response to said temperature;
   control circuitry in said apparatus having an input coupled to the sensing means for receiving said sensing means output and having an output coupled to the heating element for providing a current thereto in response to the received input;
   unitary support member for supporting the crystal housing, the heating element and the temperature sensing means; and
   spring clip means mounted on the support member and having a first position for biasing the heating element against the crystal housing and for retaining the housing on the support member, and having a second position wherein the clip means is pivotable to allow release of the crystal housing from the support member.

2. The crystal stabilizing assembly in accordance with claim 1 wherein the heating element is a resistor.

3. A crystal stabilizing assembly in accordance with claim 1 wherein the heating element is a carbon resistor.

4. A crystal stabilizing assembly in accordance with claim 1 wherein the temperature sensing means is a thermistor.

5. A crystal stabilizing assembly in accordance with claim 1 wherein the unitary support member is a rigid molded plastic socket.

6. The crystal stabilizing assembly in accordance with claim 1 wherein the unitary support member comprises means for receiving the terminals of the crystal.

7. A crystal stabilizing assembly in accordance with claim 1 wherein the unitary support member has pedestal means for supporting the heating element near one side of the crystal housing.

8. The crystal stabilizing assembly in accordance with claim 1 and further comprising additional pairs of crystals and heating elements, each heating element coupled to the output of the control circuitry for receiving said heating current.

9. The crystal stabilizing assembly according to claim 1 wherein the spring clip, having a first stable position for biasing the heating element against the crystal housing, is pivotally mounted in the socket for rotation when in other than said first stable position whereby access may be had to the crystal, the heating element and the temperature sensing means.

10. The crystal stabilizing assembly in accordance with claim 1 wherein the spring clip means is a stainless steel wire spring.

11. A crystal stabilizing assembly for electronic apparatus comprising:
    a frequency controlling crystal;
    a hermetically sealed crystal housing for retaining the crystal;
    a heating element in contact with the outer surface of the crystal housing for conduction heating of said housing;
    temperature sensing means in contact with the heating element for sensing the temperature of said heating element;
    a unitary support member for supporting the crystal housing, the heating element and the temperature sensing means; and
    spring clip means mounted on the support member and having a first position for biasing the heating element against the crystal housing and for retaining the crystal housing on the support member and having a second position wherein the clip means is pivotable to allow release of the crystal housing from the support member.

* * * * *